(12) United States Patent
Fang et al.

(10) Patent No.: US 10,950,557 B2
(45) Date of Patent: Mar. 16, 2021

(54) STACKED CHIP PACKAGE STRUCTURE AND MANUFACTURING METHOD THEREOF

(71) Applicant: Powertech Technology Inc., Hsinchu County (TW)

(72) Inventors: Li-Chih Fang, Hsinchu County (TW); Ji-Cheng Lin, Hsinchu County (TW); Che-Min Chu, Hsinchu County (TW); Chun-Te Lin, Hsinchu County (TW); Chien-Wen Huang, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 16/780,921

(22) Filed: Feb. 4, 2020

(65) Prior Publication Data
US 2020/0176395 A1 Jun. 4, 2020

Related U.S. Application Data

(62) Division of application No. 15/455,149, filed on Mar. 10, 2017, now abandoned.

(Continued)

(30) Foreign Application Priority Data

Nov. 14, 2016 (TW) .................................. 105137133

(51) Int. Cl.
*H01L 21/56* (2006.01)
*H01L 23/538* (2006.01)
(Continued)

(52) U.S. Cl.
CPC ............ *H01L 23/552* (2013.01); *H01L 24/19* (2013.01); *H01L 24/24* (2013.01); *H01L 24/82* (2013.01);
(Continued)

(58) Field of Classification Search
None
See application file for complete search history.

(56) References Cited

U.S. PATENT DOCUMENTS

2013/0040423 A1* 2/2013 Tung .................. H01L 25/0657
438/107
2014/0182911 A1* 7/2014 Lee ......................... H05K 1/185
174/260

(Continued)

*Primary Examiner* — Xiaoming Liu
(74) *Attorney, Agent, or Firm* — JCIPRNET

(57) ABSTRACT

A manufacturing method of a stacked chip package structure includes the following steps. A first chip is disposed on a carrier, wherein the first chip has a first active surface and a plurality of first pads disposed on the first active surface. A second chip is disposed on the first chip without covering the first pads and has a second active surface and a plurality of second pads disposed on the second active surface. A plurality of first stud bumps are formed on the first pads. A plurality of pillar bumps are formed on the second pads. The first chip and the second chip are encapsulated by an encapsulant, wherein the encapsulant exposes a top surface of each second stud bump. A plurality of first vias are formed by a laser process, wherein the first vias penetrate the encapsulant and expose the first stud bumps. A conductive layer is formed in the first vias to form a plurality of first conductive vias. The carrier is removed.

13 Claims, 8 Drawing Sheets

Related U.S. Application Data

(60) Provisional application No. 62/316,843, filed on Apr. 1, 2016.

(51) Int. Cl.
*H01L 23/552* (2006.01)
*H01L 23/00* (2006.01)
*H01L 25/065* (2006.01)
*H01L 23/498* (2006.01)

(52) U.S. Cl.
CPC ...... H01L 25/0652 (2013.01); H01L 25/0657 (2013.01); *H01L 21/568* (2013.01); *H01L 23/49816* (2013.01); *H01L 23/5389* (2013.01); *H01L 24/32* (2013.01); *H01L 2224/04105* (2013.01); *H01L 2224/12105* (2013.01); *H01L 2224/24145* (2013.01); *H01L 2224/24146* (2013.01); *H01L 2224/32145* (2013.01); *H01L 2224/73267* (2013.01); *H01L 2224/82005* (2013.01); *H01L 2224/82039* (2013.01); *H01L 2224/83005* (2013.01); *H01L 2224/92244* (2013.01); *H01L 2225/06527* (2013.01); *H01L 2225/06562* (2013.01); *H01L 2924/14* (2013.01); *H01L 2924/1438* (2013.01); *H01L 2924/3025* (2013.01)

(56) References Cited

U.S. PATENT DOCUMENTS

| | | | | |
|---|---|---|---|---|
| 2015/0001725 | A1* | 1/2015 | Hu | H01L 25/105 |
| | | | | 257/762 |
| 2015/0262928 | A1* | 9/2015 | Shen | H01L 23/04 |
| | | | | 257/676 |
| 2015/0380377 | A1* | 12/2015 | Uzoh | H01L 24/14 |
| | | | | 257/773 |

* cited by examiner

US 10,950,557 B2

STACKED CHIP PACKAGE STRUCTURE AND MANUFACTURING METHOD THEREOF

CROSS-REFERENCE TO RELATED APPLICATION

This application is a divisional application of and claims the priority benefit of U.S. patent application Ser. No. 15/455,149, filed on Mar. 10, 2017, now pending. The U.S. patent application Ser. No. 15/455,149 claims the priority benefits of U.S. provisional application Ser. No. 62/316,843, filed on Apr. 1, 2016 and Taiwan application serial no. 105137133, filed on Nov. 14, 2016. The entirety of each of the above-mentioned patent applications is hereby incorporated by reference herein and made a part of this specification.

BACKGROUND OF THE INVENTION

Field of the Invention

The present invention generally relates to a chip package structure and a manufacturing method thereof. More particularly, the present invention relates to a stacked chip package structure and a manufacturing method thereof.

Description of Related Art

Recently, attention has paid to a semiconductor device called a "substrate with a built-in chip" in which a chip and the like are embed in a substrate made of resin and the like and a semiconductor device in which an insulating layer and a wiring layer are formed on the chip. In semiconductor devices such as a substrate with a built-in chip, it is necessary to bury a chip in the insulating layer, and further form a via hole through the insulating layer to electrically connect an electrode pad on the chip to an external electric terminal.

In general, the via hole is typically formed by using a laser beam. In this case, the laser beam passes through the insulating layer, and the electrode pad of the chip made of Al and the like may be flied apart by irradiation of the laser beam. As a result, the device including a semiconductor chip is disadvantageously damaged.

SUMMARY OF THE INVENTION

Accordingly, the present invention is directed to a stacked chip package structure which has favourable reliability, lower production cost and thinner overall thickness.

The present invention is further directed to a manufacturing method of the stacked chip package structure, which improves reliability and yield of the stacked chip package structure and reduces production cost and overall thickness of the stacked chip package structure.

The present invention provides a stacked chip package structure including a first chip, a plurality of first stud bumps, a second chip, a plurality of pillar bumps, an encapsulant and a plurality of first conductive vias. The first chip has a first active surface and a plurality of first pads disposed on the first active surface. The first stud bumps are disposed on the first pads. The second chip is disposed on the first chip without covering the first pads, and the second chip has a second active surface and a plurality of second pads disposed on the second active surface. The pillar bumps are disposed on the second pads. The encapsulant encapsulates the first chip and the second chip and exposes a top surface of each of the second stud bumps. The first conductive vias penetrate the encapsulant and are coupled to the first stud bumps.

The present invention further provides a manufacturing method of a stacked chip package structure, and the method includes the following steps. A first chip is disposed on a carrier, wherein the first chip has a first active surface and a plurality of first pads disposed on the first active surface. A second chip is disposed on the first chip without covering the first pads and has a second active surface and a plurality of second pads disposed on the second active surface. A plurality of first stud bumps are formed on the first pads. A plurality of pillar bumps are formed on the second pads. The first chip and the second chip are encapsulated by an encapsulant, wherein the encapsulant exposes a top surface of each second stud bump. A plurality of first vias are formed by a laser process, wherein the first vias penetrate the encapsulant and expose the first stud bumps. A conductive layer is formed in the first vias to form a plurality of first conductive vias. The carrier is removed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
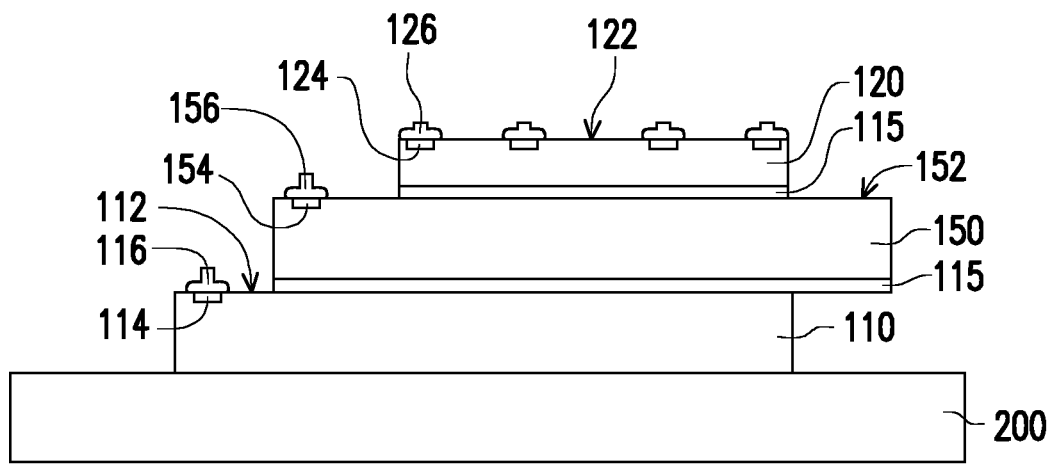
FIG. 1 to FIG. 8 illustrate cross-sectional views of a manufacturing process of a stacked chip package structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
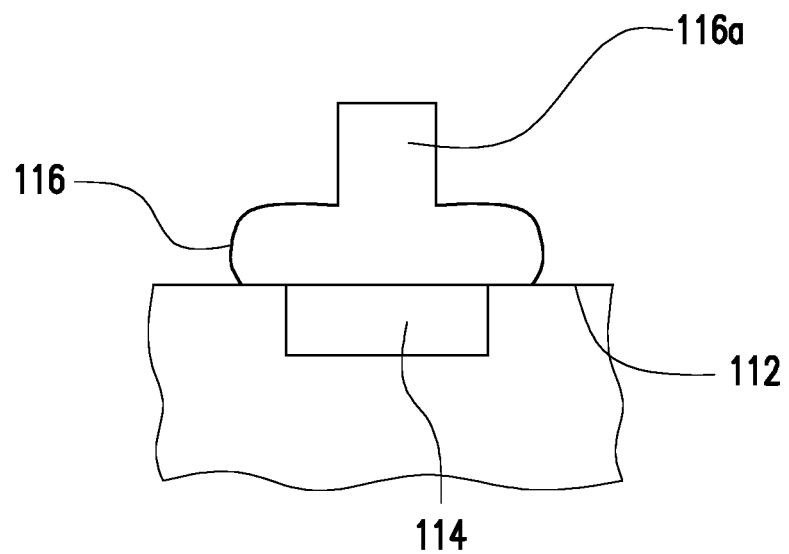

FIG. 1 to FIG. 8 illustrate cross-sectional views of a manufacturing process of a stacked chip package structure according to an embodiment of the invention. In the present embodiment, a manufacturing process of a stacked chip package structure may include the following steps. Referring to FIG. 1 and FIG. 2, a first chip 110 may be disposed on a carrier 200. The first chip 110 has a first active surface 112 and a plurality of first pads 114 disposed on the first active surface 112. A second chip 120 may then be disposed on the first chip 110. The second chip 120 may be disposed on the first chip 110 without covering the first pads 114 and may have a second active surface 122 and a plurality of second pads 124 disposed on the second active surface 122.

In the present embodiment, before the second chip 120 is disposed on the first chip 110, a third chip 150 may be disposed on the first chip 110. The third chip 150 is located between the first chip 110 and the second chip 120 as shown in FIG. 1. The third chip 150 has a third active surface 152 and a plurality of third pads 154 disposed on the third active surface 152. The first chip 110, the third chip 150 and the second chip 120 are sequentially stacked on top of one another. The third chip 150 does not cover the first pads 114 of the first chip 110. The second chip 120 does not cover the third pads 154 of the third chip 150. Thus, the third chip 150 exposes the first pads 114 of the first chip 110, and the second chip 120 exposes the third pads 154 of the third chip 150. A die attach film (DAF) 115 may be disposed between the first chip 110 and the third chip 150. Another die attach film (DAF) 115 may be disposed between the third chip 150 and the second chip 120. The die attach film (DAF) 115 may be used to bond the chips 110, 150, 120 to one another. In the present embodiment, the first chip 110 and the third chip 150 are flash memories and the second chip 120 is the controller, but the invention is not limited thereto.

Then, a plurality of first stud bumps 116 are respectively formed on the first pads 114. A plurality of pillar bumps 126 are respectively formed on the second pads 124. A plurality of second stud bumps 156 are respectively formed on the third pads. Each of the first stud bumps 116 may include a protruded knot 116a as shown in FIG. 2. Each of the second stud bumps 156 may include a protruded knot. Each of the pillar bumps 126 may be in a pillar shape or may include a protruded knot as each of the first stud bumps 116 does.

Figure 3:
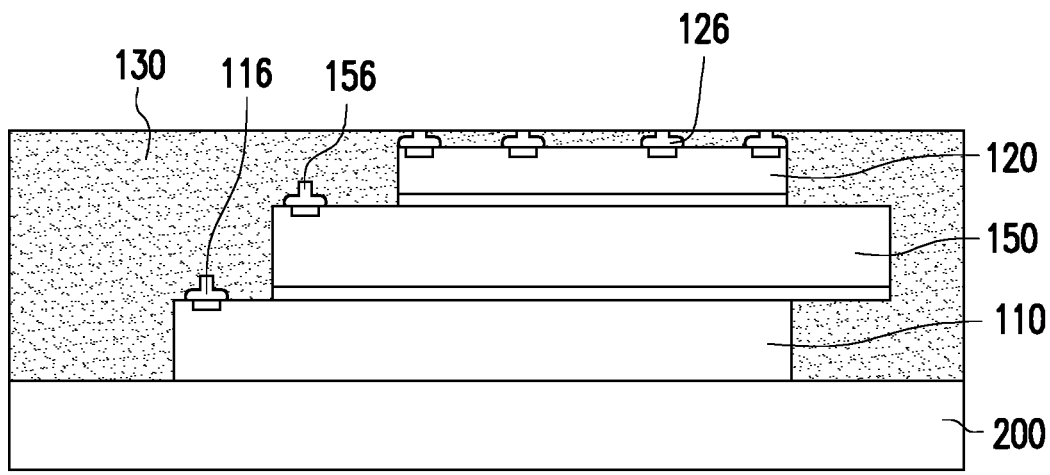

Next, referring to FIG. 3, the first chip 110, the second chip 120 and the third chip 150 are encapsulated by an encapsulant 130. In the present embodiment, the encapsulant 130 may encapsulate the first chip 110, the third chip 150, the second chip 120 and the pillar bumps 126 disposed on the second chip 120. The height of the encapsulant 130 may be greater than the height of the pillar bumps 126. Then, a grinding process is performed on the encapsulant 130 until a top surface of each of the pillar bumps 126 is exposed. As such, a top surface of the encapsulant 130 is coplanar with the top surface of each of the pillar bumps 126 as shown in FIG. 3. With such configuration, the thickness of the stacked chip package structure may be further reduced. The process of forming conductive vias for the second chip 120 may be omitted. Thus, the production cost of the stacked chip package structure may be reduced.

Figure 4:
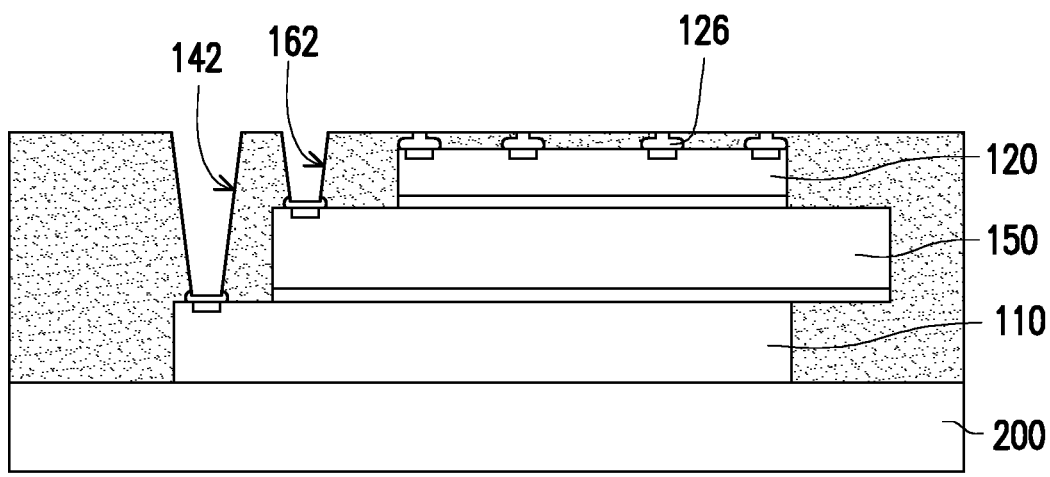
Figure 6:
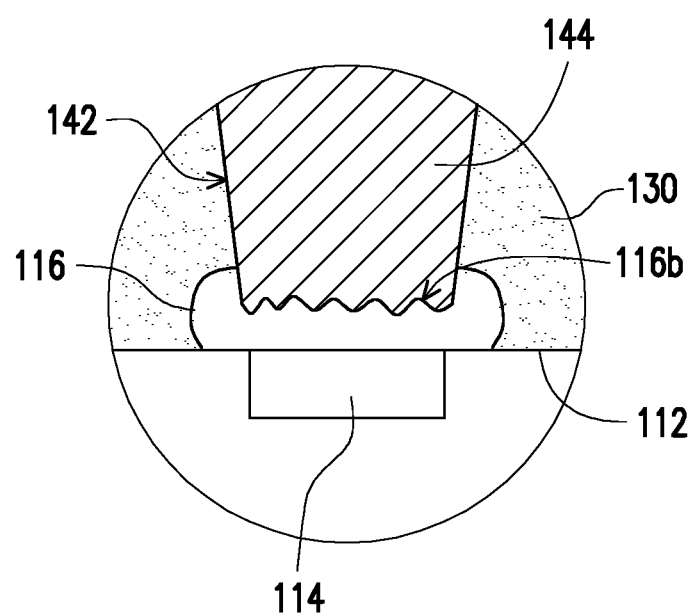

Then, referring to FIG. 4, a plurality of first vias 142 and a plurality of second vias 162 are formed by laser process. The first vias 14 may penetrate the encapsulant 130 until the first vias 14 respectively expose the first stud bumps 116. A top surface of each first stud bump 116 is roughened by the laser process during the formation of the first vias 142 to form a rough surface 116b (as illustrated in FIG. 6) of each of the first stud bumps 116. Therefore, the first stud bumps 116 are able to prevent the first pads 114 being damaged during the formation of the first vias 142. In addition, the rough surface 116b of each first stud bump 116 is rougher than a top surface of each first pad 114. The rough surface 116b of each first stud bump 116 may enhance the bonding strength between the first stud bumps 116 and the conductive layer 144 subsequently formed thereon. In the present embodiment, at least one part of the protruded knot 116a of the first stud bump 116 as shown in FIG. 2 is removed during the laser process, but the invention is not limited thereto. In one embodiment, the protruded knot 116a of the first stud bump 116 as shown in FIG. 2 may merely be roughened into a rough knot by the laser process. That is to say, the rough surface 116b may include a rough knot. Each of the first conductive vias 140 may cover the rough knot of each first stud bump 116.

In the present embodiment, the second vias 162 penetrate the encapsulant 130 until the second vias 162 respectively expose the second stud bumps 156. As such, a top surface of each second stud bump 156 is roughened by the laser process during the formation of the second vias 162, so as to prevent the third pads 154 underneath the second stud bumps 156 from being damaged during the formation of the second vias 162. In addition, the rough surface of the second stud bump 156 is rougher than a top surface of the third pad 154. In this way, the bonding strength between the second stud bumps 156 and the conductive layer 164 subsequently formed thereon may be enhanced.

Figure 5:
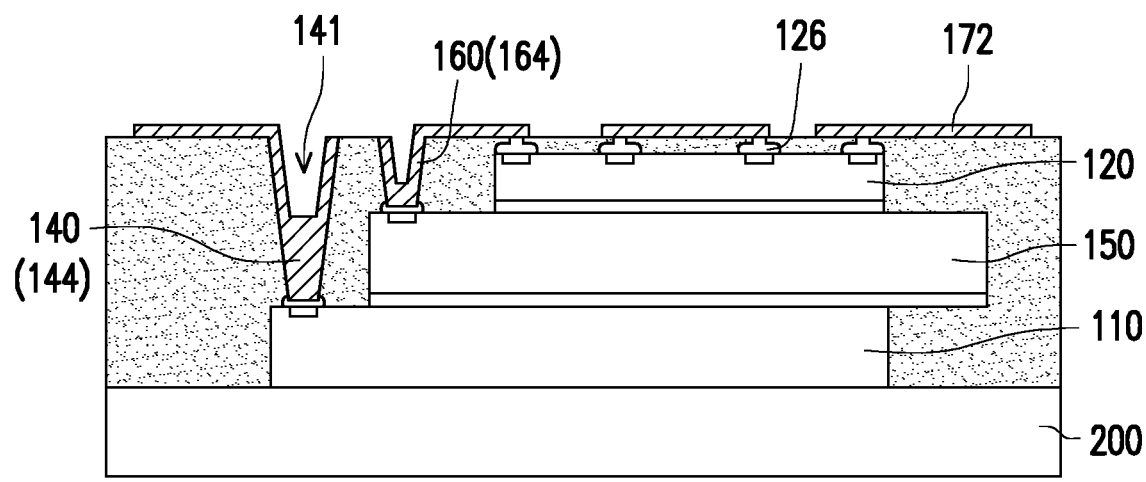

Next, referring to FIG. 5 and FIG. 6, a conductive layer 144 is formed in the first vias 142 to form a plurality of first conductive vias 140. The conductive layer 144 covers the rough surface 116b of each first stud bump 116 as shown in FIG. 6 to enhance the bonding strength between the first stud bumps 116 and the conductive layer 144. As such, the first conductive vias 140 may penetrate the encapsulant 130 and be coupled to each respective first stud bump 116. In the present embodiment, the conductive layer 144 may be a metal layer covering the inner surface of the first via 142 without completely filling the first via 142. A void 141 may exist in the first via 142, but the invention is not limited thereto. A conductive layer 164 may also be formed in the second vias 162 to form a plurality of second conductive vias 160. The rough surface of each second stud bump 156 may be used to enhance the bonding strength between the second stud bumps 156 and the conductive layer 164. As such, the second conductive vias 160 penetrate the encapsulant 130 and are couple to each respective second stud bump 156.

Figure 7:
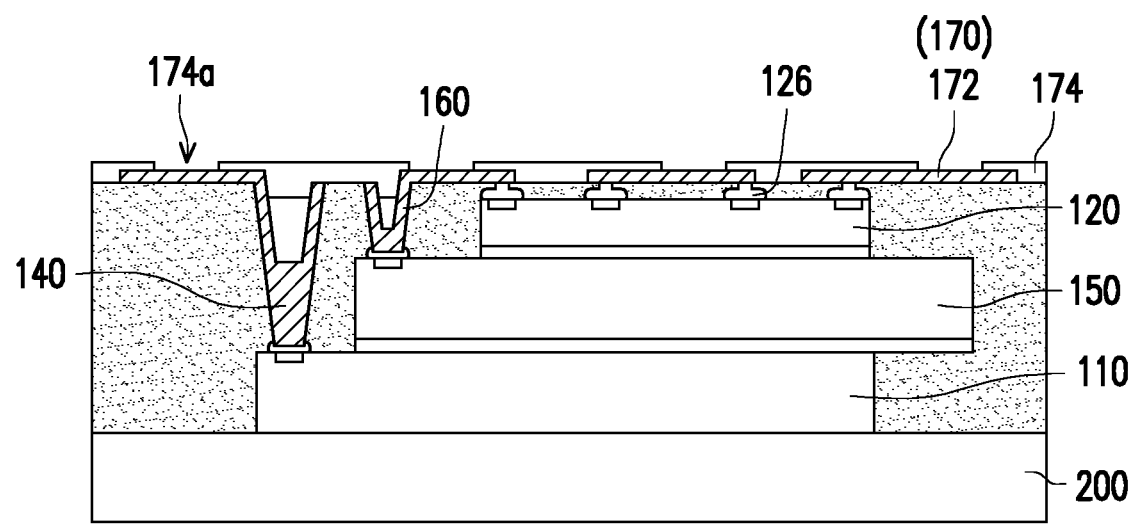

Next, referring to FIG. 7, a redistribution layer 170 is formed on the encapsulant 130. The redistribution layer 170 includes a circuit layer 172 electrically connected to the first chip 110, the third chip 150 and the second chip 120 through the first conductive vias 140, the second conductive vias 160 and the pillar bumps 126. The metal layer used to form the redistribution layer 170 may be formed in the same process step as forming of the conductive layer 144. Namely, the circuit layer 172 of the redistribution layer 170 and the conductive layer 144 of the first conductive vias 140 may be formed in the same process. The conductive layer 164 of the second conductive vias 160 may also be formed in the same process as forming the circuit layer 172 and the conductive layer 144. Then, a passivation layer 174 is formed on the redistribution layer 170. The passivation layer 174 includes a plurality of openings 174a exposing a part of the redistribution layer 170.

Figure 8:
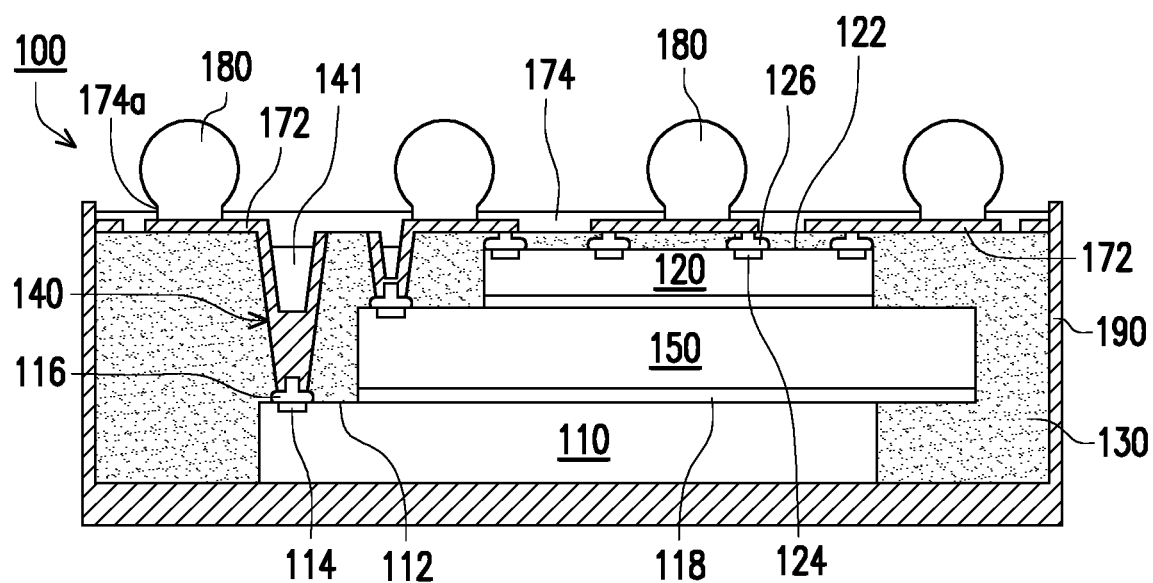

Then, referring to FIG. 8, a plurality of solder balls 180 are formed on the openings 174a of the passivation layer 170. The solder balls 180 are coupled to the circuit layer 172 to electrically connect the package structure 100 to an external device. Then, the carrier 200 may be removed. A shielding layer 190 may be formed on the back surface of the first chip 110 and an outer surface of the encapsulant 130 to protect the package structure 100 from environmental, thermal, and electromagnetic interference. The shielding layer 190 may be formed using conductive material sprayed onto the encapsulant 130 or a conductive metal sheet conformed onto the encapsulant. The shielding layer may be electrically connected to a ground or a voltage source of the stacked chip package. At the time, the manufacturing process of the stacked chip package structure 100 may be substantially done.

Figure 9:
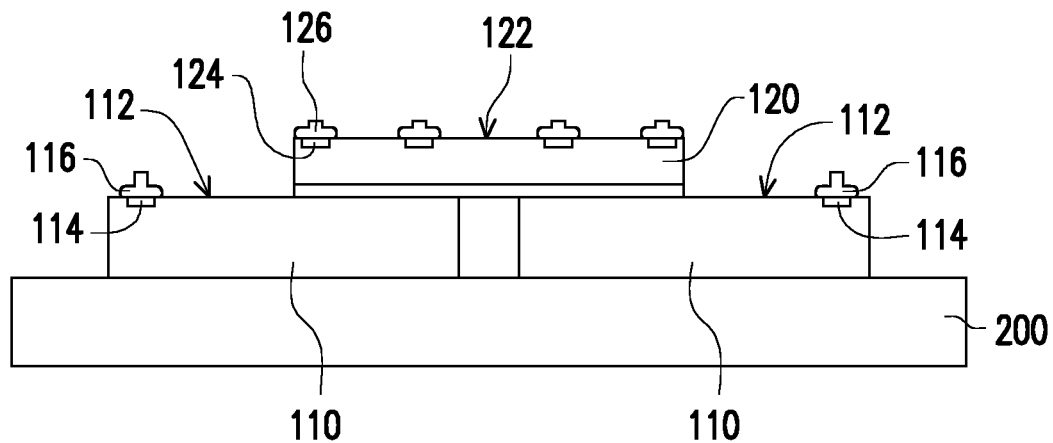
FIG. 9 to FIG. 11 illustrate cross-sectional views of a manufacturing process of a stacked chip package structure according to another embodiment of the invention.
Figure 10:
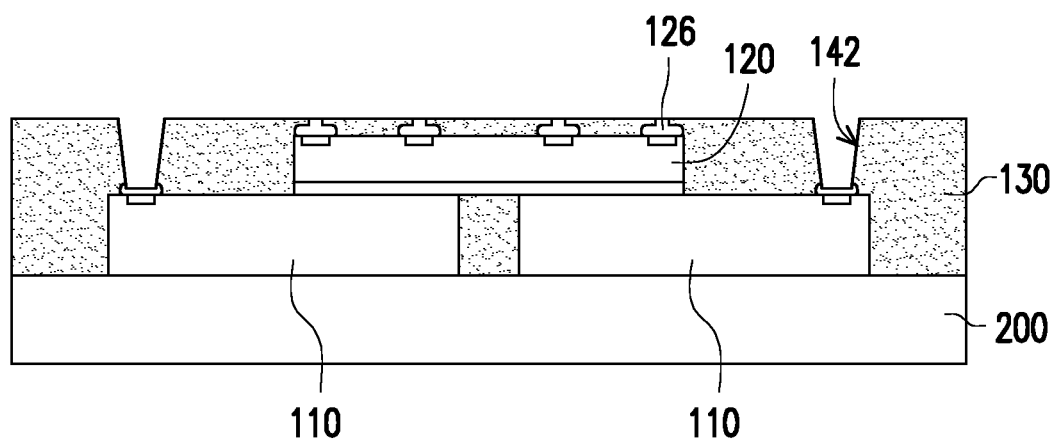
Figure 11:
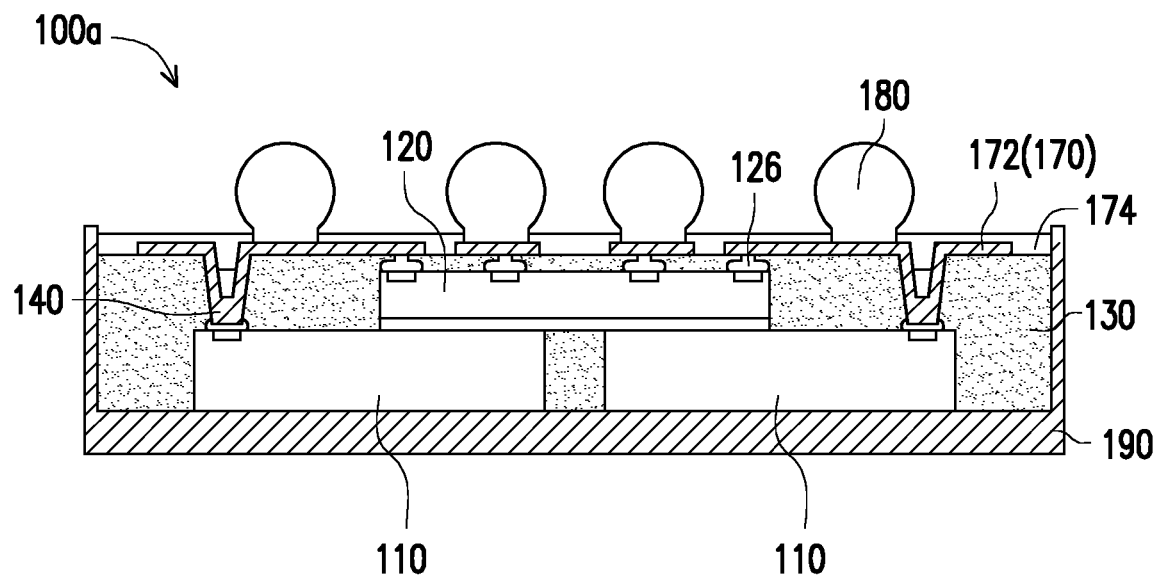

FIG. 9 to FIG. 11 illustrate cross-sectional views of a manufacturing process of a stacked chip package structure according to another embodiment of the invention. It is noted that the manufacturing process of the stacked chip package structure 100a as shown in FIG. 9 to FIG. 11 contains many features same as or similar to the manufacturing process of the stacked chip package structure 100 disclosed earlier with FIG. 1 to FIG. 8. For purpose of clarity and simplicity, detail description of same or similar features may be omitted, and the same or similar reference numbers denote the same or like components. The main differences between the manufacturing process of the stacked chip package structure 100a and the stacked chip package structure 100 are described as follows.

In the present embodiment, there is more than one first chip 110. Multiple first chips 110 may be disposed on the carrier 200. The first chips 110 are arranged in a side-by-side manner. The second chip 120 may be disposed on the first chips 110 as shown in FIG. 9. In the present embodiment the third chip 150 may be omitted, but the invention is not limited thereto. Accordingly, the first chips 110 and the second chip 120 are then encapsulated by the encapsulant 130. The encapsulant 130 may expose the top surface of the pillar bumps 126 of the second chip as shown in FIG. 10. Then, the first conductive vias 140, the redistribution layer 170, the passivation layer 174, the solder balls 180 and the shielding layer 190 may be formed by the same process described above to form the stacked chip package structure 100a shown in FIG. 11.

FIG. 12 to FIG. 15 illustrate cross-sectional views of a manufacturing process of a stacked chip package structure according to yet another embodiment of the invention. It is noted that the manufacturing process of the stacked chip package structure 100b as shown in FIG. 12 to FIG. 15 contains many features same as or similar to the manufacturing process of the stacked chip package structure 100 disclosed earlier with FIG. 1 to FIG. 8 and the manufacturing process of the stacked chip package structure 100a disclosed earlier with FIG. 9 to FIG. 11. For purpose of clarity and simplicity, detail description of same or similar features may be omitted, and the same or similar reference numbers denote the same or like components. The main differences between the manufacturing process of the stacked chip package structure 100b and the stacked chip package structure 100 are described as follows.

Figure 12:
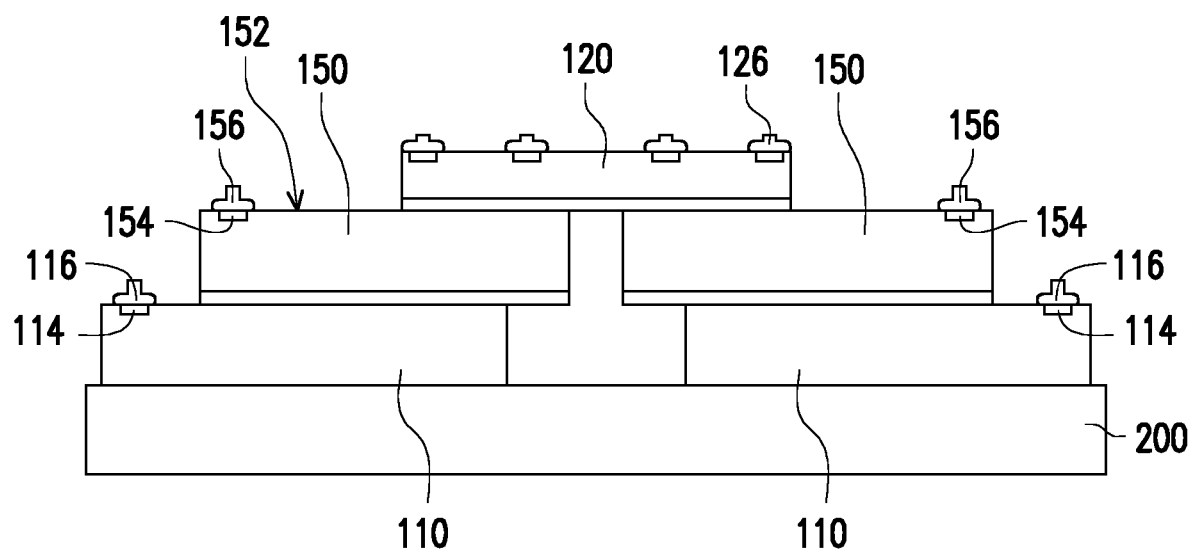
FIG. 12 to FIG. 15 illustrate cross-sectional views of a manufacturing process of a stacked chip package structure according to yet another embodiment of the invention.
Figure 13:
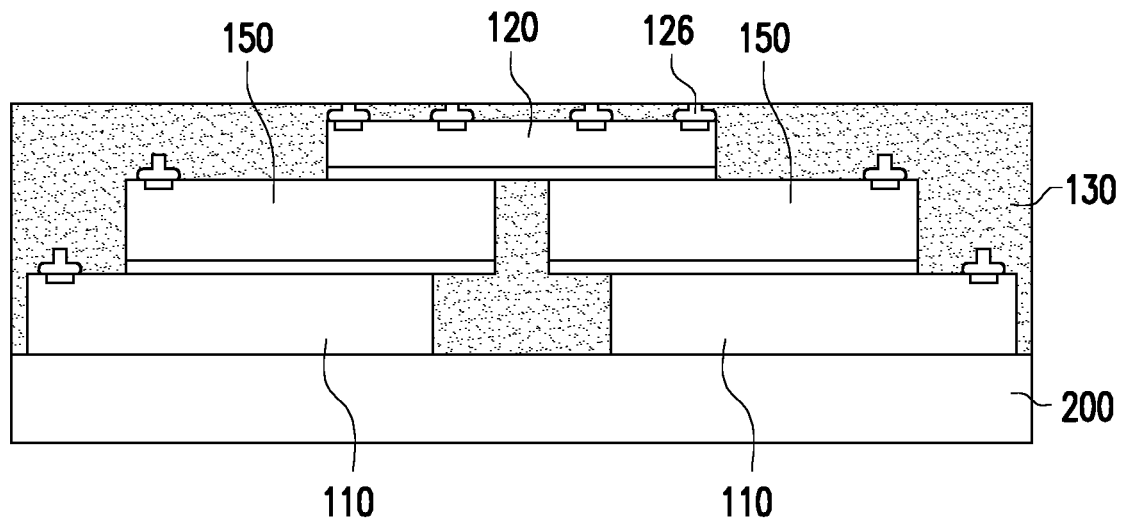

In the present embodiment, there may be more than one first chip 110. Multiple first chips 110 are disposed on the carrier 200. The first chips 110 are arranged in a side-by-side manner. Herein, before the second chip 120 is disposed on the first chips 110, a plurality of third chips 150 are firstly disposed on the first chips 110 respectively without covering the first pads 114 of the first chips 110. The third chips 150 may be disposed between the first chips 110 and the second chip 120 as shown in FIG. 12. In the present embodiment, each of the third chips 150 has a third active surface 152 and a plurality of third pads 154 disposed on the third active surface 152. The second chip 120 is disposed on the third chip 150 without covering the third pads 154 of the third chips.

Then, similar to the previous embodiment, a plurality of first stud bumps 116 are respectively formed on the first pads 114, a plurality of pillar bumps 126 are respectively formed on the second pads 124, and a plurality of second stud bumps 156 are respectively formed on the third pads. Next, referring to FIG. 13, the first chip 110, the third chip 150 and the second chip 120 are encapsulated by an encapsulant 130. The encapsulant 130 may be ground to expose the top surface of each pillar bumps 126.

Figure 14:
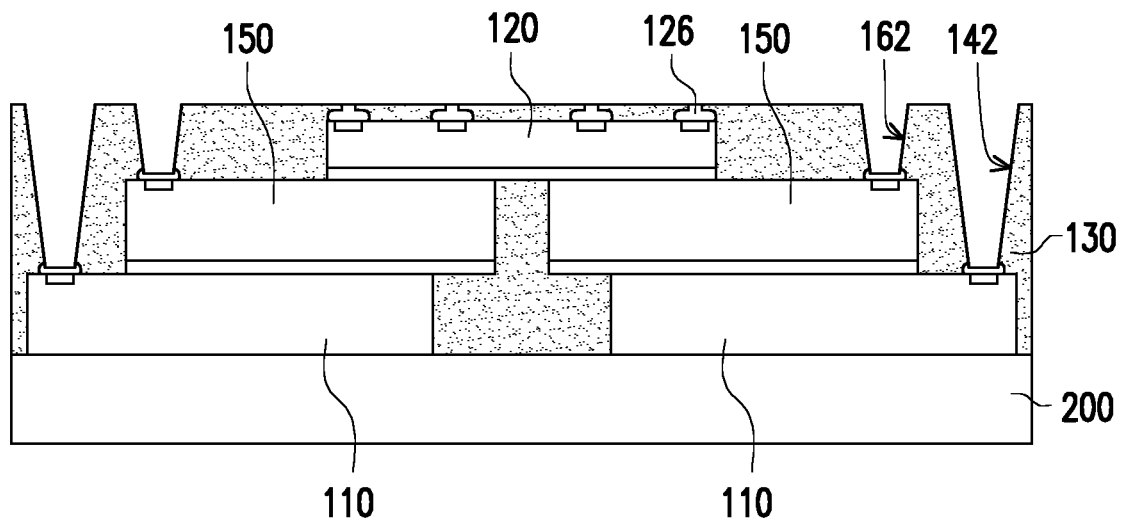

Next, referring to FIG. 14, a plurality of first vias 142 and a plurality of second vias 162 are formed by laser process. The first vias 142 and the second vias 162 may penetrate the encapsulant 130 until they expose the first stud bumps 116 and the second stud bumps 156. The first stud bumps 116 and the second stud bumps 156 may prevent the first pads 114 and the third pads 154 from being damaged during the formation of the first vias 142 and the second vias 162. Accordingly, the rough surfaces are formed on top of the first stud bumps 116 and the second stud bumps 156 during the laser process. The bonding strength between the stud bumps 116, 156 and the conductive layers 144, 164 subsequently formed thereon may be enhanced by the rough surfaces.

Figure 15:
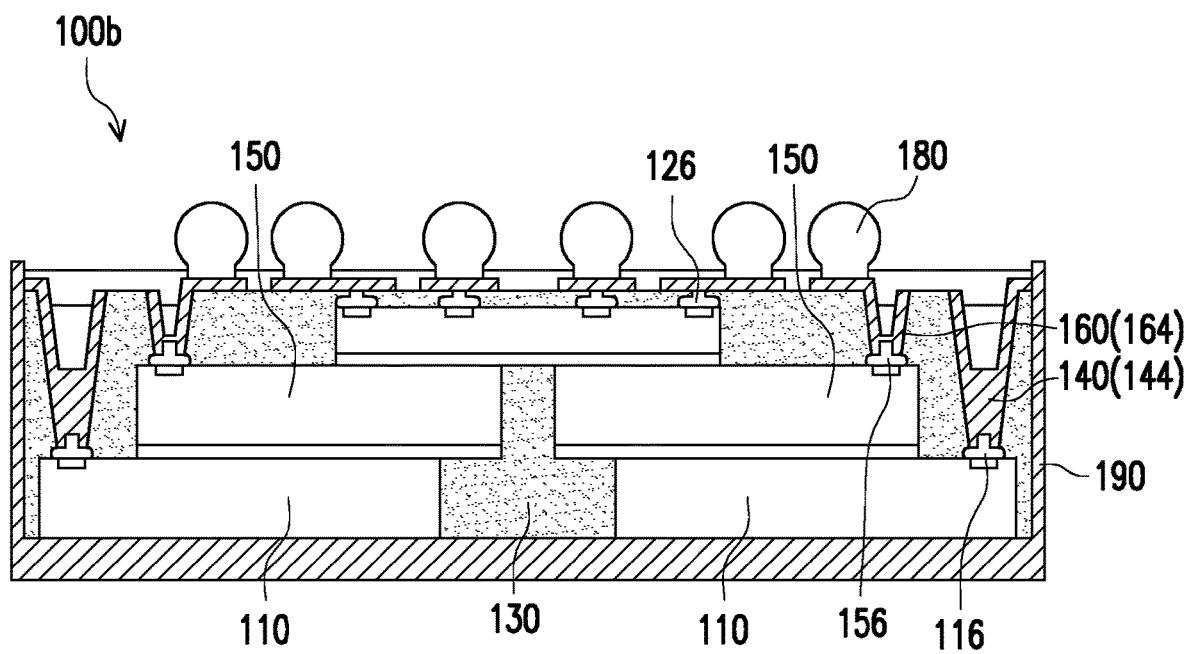

Then, referring to FIG. 15, conductive layers 144, 164 are formed in the first vias 142 and the second vias 162 to form a plurality of first conductive vias 140 and a plurality of second conductive vias 160, such that the first conductive vias 140 and the second conductive vias 160 penetrate the encapsulant 130 and are coupled to the first stud bumps 116 and the second stud bumps 156. Next, the redistribution layer 170, the passivation layer 174, the solder balls 180 and the shielding layer 190 may be formed by the same process described above to form the stacked chip package structure 100b shown in FIG. 15.

In sum, in the present invention, the chips are stacked on top of one another on the carrier. The stud bumps/pillar bumps are formed on the pads of the chips before stacking or after stacking the chips. Then, encapsulant is formed to encapsulate the chips and expose the pillar bumps of the topmost chip. The vias may penetrate the encapsulant to expose the stud bumps of the lower chips are formed by laser process. The stud bumps are used to prevent the pads of the lower chips from being damaged by the laser process. In addition, the top surfaces of the stud bumps are roughened by the laser process. The rough surface may enhance the bonding strength between the stud bumps and the conductive vias. Therefore, the manufacturing method in the present invention improves reliability and yield of the stacked chip package structure manufactured thereby. Also, with such configuration, the overall thickness and the production cost of the stacked chip package structure may be reduced.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a stacked chip package structure, comprising:
  disposing a first chip on a carrier, wherein the first chip has a first active surface and a plurality of first pads disposed on the first active surface;
  disposing a second chip on the first chip, wherein the second chip exposes the first pads and has a second active surface and a plurality of second pads disposed on the second active surface;
  forming a plurality of first stud bumps on the first pads;
  forming a plurality of pillar bumps on the second pads;
  encapsulating the first chip and the second chip by an encapsulant, wherein the encapsulant exposes a top surface of each of the pillar bumps;
  forming a plurality of first vias by a laser process, wherein the first vias penetrate the encapsulant and expose the first stud bumps;
  forming a recessed area on each of the first stud bumps by the laser process;
  roughening a surface of the recessed area of each of the first stud bumps by the laser process to form a rough surface;

forming a conductive layer in the first vias to form a plurality of first conductive vias, wherein after forming the conductive layer in the first vias to form the plurality of first conductive vias, the conductive layer at least partially conforms to the rough surface of each of the first stud bumps; and removing the carrier, wherein a shape of the plurality of first stud bumps before the step of encapsulating the first chip and the second chip by the encapsulant is substantially the same as a shape of the plurality of first stud bumps after the step of forming the conductive layer in the first vias to form the plurality of first conductive vias, and each of the plurality of first stud bumps includes a protruded knot before the step of encapsulating the first chip and the second chip by the encapsulant.

2. The manufacturing method of the stacked chip package structure as claimed in claim 1, further comprising:
forming a redistribution layer on the encapsulant, wherein the redistribution layer comprises a circuit layer electrically connected to the first chip and the second chip through the first conductive vias and the pillar bumps.

3. The manufacturing method of the stacked chip package structure as claimed in claim 2, further comprising:
forming a passivation layer on the redistribution layer, wherein the passivation layer comprises a plurality of openings exposing a part of the redistribution layer.

4. The manufacturing method of the stacked chip package structure as claimed in claim 3, further comprising:
forming a plurality of solder balls on the openings of the passivation layer, wherein the solder balls are electrically connected to the circuit layer.

5. The manufacturing method of the stacked chip package structure as claimed in claim 1, further comprising:
forming a shielding layer on an outer surface of the encapsulant.

6. The manufacturing method of the stacked chip package structure as claimed in claim 1, wherein a top surface of each of the first stud bumps is roughened by the laser process to form a rough surface, and the conductive layer covers the rough surface of each of the first stud bumps.

7. The manufacturing method of the stacked chip package structure as claimed in claim 1, further comprising:
disposing a third chip on the first chip without covering the first pads before the second chip is disposed on the first chip, wherein the third chip has a third active surface and a plurality of third pads disposed on the third active surface, and the second chip is disposed on the third chip without covering the third pads;
forming a plurality of second stud bumps on the third pads; and
forming a plurality of second conductive vias penetrating the encapsulant and coupled to the second stud bumps.

8. The manufacturing method of the stacked chip package structure as claimed in claim 1, wherein the number of the first chip is plural, the first chips are arranged in a side-by-side manner, and the second chip is disposed on the first chips.

9. The manufacturing method of the stacked chip package structure as claimed in claim 8, further comprising:
disposing a plurality of third chips on the first chips without covering the first pads of the first chips before the second chip is disposed on the first chips, wherein each of the third chips has a third active surface and a plurality of third pads disposed on the third active surface, and the second chip is disposed on the third chips without covering the third pads of the third chips;
forming a plurality of second stud bumps on the third pads; and
forming a plurality of second conductive vias penetrating the encapsulant and coupled to the second stud bumps.

10. The manufacturing method of the stacked chip package structure as claimed in claim 1, wherein the conductive layer completely covers the rough surface of each of the first stud bumps.

11. The manufacturing method of the stacked chip package structure as claimed in claim 1, wherein each of the first conductive vias protrudes into the recessed area of a corresponding first stud bump and at least partially conforms to the rough surface of the corresponding first stud bump.

12. The manufacturing method of the stacked chip package structure as claimed in claim 1, wherein the encapsulant completely covers the sidewalls of the first conductive vias, and there is no interface in the encapsulant.

13. The manufacturing method of the stacked chip package structure as claimed in claim 1, wherein each of the plurality of first stud bumps includes only one protruded knot before the step of encapsulating the first chip and the second chip by the encapsulant.

\* \* \* \* \*